United States Patent
Sasaki et al.

(10) Patent No.: US 7,681,096 B2
(45) Date of Patent: Mar. 16, 2010

(54) SEMICONDUCTOR INTEGRATED CIRCUIT, BIST CIRCUIT, DESIGN PROGRAM OF BIST CIRCUIT, DESIGN DEVICE OF BIST CIRCUIT AND TEST METHOD OF MEMORY

(75) Inventors: Tomonori Sasaki, Kanagawa (JP); Toshiharu Asaka, Kanagawa (JP); Yoshiyuki Nakamura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 240 days.

(21) Appl. No.: 11/902,830

(22) Filed: Sep. 26, 2007

(65) Prior Publication Data

US 2008/0077831 A1  Mar. 27, 2008

(30) Foreign Application Priority Data

Sep. 27, 2006  (JP) .............................. 2006-262065

(51) Int. Cl.
*G11C 29/00*  (2006.01)

(52) U.S. Cl. .............................. 714/720; 714/5; 714/42; 714/54; 714/702; 714/718; 714/719; 714/723; 714/736; 711/200; 365/200; 365/201

(58) Field of Classification Search ........................ None
See application file for complete search history.

(56) References Cited

U.S. PATENT DOCUMENTS 4,300,234 A * 11/1981 Maruyama et al. .......... 714/718
5,940,875 A *  8/1999 Inagaki et al. ............... 711/217
2002/0184578 A1* 12/2002 Yoshizawa ................... 714/718
2003/0235094 A1* 12/2003 Ozawa ........................ 365/201

FOREIGN PATENT DOCUMENTS

| JP | 02-208899 | 8/1990 |
|---|---|---|
| JP | 2000-111618 A | 4/2000 |
| JP | 2000-163993 A | 6/2000 |
| JP | 2002-358797 A | 12/2002 |

\* cited by examiner

*Primary Examiner*—John P Trimmings
(74) *Attorney, Agent, or Firm*—Foley & Lardner LLP

(57) ABSTRACT

A semiconductor integrated circuit includes a memory, a BIST main circuit and a BIST sub circuit. The BIST sub circuit is to generate a row address pattern or a column address pattern of the memory and includes a boundary address generation circuit for alternately generating a top address and a bottom address of the memory for at least one of the row address pattern and the column address pattern. The BIST main circuit is provided in common with a plurality of memories and the BIST sub circuit is individually provided corresponding to the memories. The boundary address generation circuit includes a top address memory unit for storing the top address and a top/bottom address generation unit for reading out the top address and alternately outputting the top address and the bottom address.

19 Claims, 20 Drawing Sheets

|  | | | |
|---|---|---|---|
| Adrs12 | Adrs13 | Adrs14 | Adrs15 |
| Adrs8 | Adrs9 | Adrs10 | Adrs11 |
| Adrs4 | Adrs5 | Adrs6 | Adrs7 |
| Adrs0 | Adrs1 | Adrs2 | Adrs3 |

MAX ↑ row, 0 → MAX column

Fig. 3A

| 1 | 0 | 1 | 0 |
|---|---|---|---|
| 0 | 1 | 0 | 1 |
| 1 | 0 | 1 | 0 |
| 0 | 1 | 0 | 1 |

CHECKER TEST WRITTEN

Fig. 3B

| ADDRESS PATTERN | |
|---|---|
| ROW | COLUMN |
| 0 | 0 |
| MAX | 0 |
| 0 | 1 |
| MAX | 1 |
| ⋮ | ⋮ |
| MAX | MAX-1 |
| 0 | MAX |
| MAX | MAX |

| ADDRESS PATTERN | |
|---|---|
| ROW | COLUMN |
| 0 | MAX |
| MAX | MAX |
| 0 | MAX-1 |
| MAX | MAX-1 |
| ⋮ | ⋮ |
| MAX | 1 |
| 0 | 0 |
| MAX | 0 |

| ADDRESS PATTERN | |
|---|---|
| ROW | COLUMN |
| MAX | MAX |
| 0 | MAX |
| MAX | MAX-1 |
| 0 | MAX-1 |
| ⋮ | ⋮ |
| 0 | 1 |
| MAX | 0 |
| 0 | 0 |

| ADDRESS PATTERN | |
|---|---|
| ROW | COLUMN |
| MAX | 0 |
| 0 | 0 |
| MAX | 1 |
| 0 | 1 |
| ⋮ | ⋮ |
| 0 | MAX-1 |
| MAX | MAX |
| 0 | MAX |

| ADDRESS PATTERN | |
|---|---|
| ROW | COLUMN |
| 0 | 0 |
| 0 | MAX |
| 1 | 0 |
| 1 | MAX |
| . | . |
| . | . |
| MAX-1 | MAX |
| MAX | 0 |
| MAX | MAX |

| ADDRESS PATTERN | |
|---|---|
| ROW | COLUMN |
| 0 | MAX |
| 0 | 0 |
| 1 | MAX |
| 1 | 0 |
| . | . |
| . | . |
| MAX-1 | 0 |
| MAX | MAX |
| MAX | 0 |

| ADDRESS PATTERN | |
|---|---|
| ROW | COLUMN |
| MAX | MAX |
| 0 | 0 |
| MAX | MAX |
| 0 | MAX |
| MAX | 0 |
| 0 | MAX |

| ADDRESS PATTERN | |
|---|---|
| ROW | COLUMN |
| MAX | 0 |
| 0 | MAX |
| MAX | 0 |
| 0 | 0 |
| MAX | MAX |
| 0 | 0 |

| ADDRESS PATTERN | |
|---|---|
| ROW | COLUMN |
| MAX | MAX |
| 0 | 0 |
| MAX | MAX |
| MAX | 0 |
| 0 | MAX |
| MAX | 0 |

| ADDRESS PATTERN | |
|---|---|
| ROW | COLUMN |
| 0 | MAX |
| MAX | 0 |
| 0 | MAX |
| 0 | 0 |
| MAX | MAX |
| 0 | 0 |

Fig. 14A

| | | | |
|---|---|---|---|
| Adrs_c (1100) | Adrs_d (1101) | Adrs_e (1110) | Adrs_f (1111) |
| Adrs_8 (1000) | Adrs_9 (1001) | Adrs_a (1010) | Adrs_b (1011) |
| Adrs_4 (0100) | Adrs_5 (0101) | Adrs_6 (0110) | Adrs_7 (0111) |
| Adrs_0 (0000) | Adrs_1 (0001) | Adrs_2 (0010) | Adrs_3 (0011) | row column
Adrs_x ( xx xx)

MAX
Row (11)
Row (10)
Row (01)
Row (00)

Column (00) Column (01) Column (10) Column (11) MAX

Fig. 14B

Row (11): 1 1 1 1 ←
Row (10): 0 0 0 0 ←
Row (01): 1 1 1 ④ 1 ←
Row (00): 0 0 0 ① 0 ←

Column (00) Column (01) Column (10) Column (11)

Markers: ①②③④⑤⑥⑦

Fig. 16A

| | Column (00) | Column (01) | Column (10) | Column (11) MAX |
|---|---|---|---|---|
| MAX Row (11) | Adrs_c(1100) | Adrs_d(1101) | Adrs_e(1110) | Adrs_f(1111) |
| Row (10) | Adrs_8(1000) | Adrs_9(1001) | Adrs_a(1010) | Adrs_b(1011) |
| Row (01) | Adrs_4(0100) | Adrs_5(0101) | Adrs_6(0110) | Adrs_7(0111) |
| Row (00) | Adrs_0(0000) | Adrs_1(0001) | Adrs_2(0010) | Adrs_3(0011) | row column
Adrs x ( xx xx)

Fig. 16B

| | Column (00) | Column (01) | Column (10) | Column (11) |
|---|---|---|---|---|
| Row (11) | 0 | 1 | 0 | 1 |
| Row (10) | 0 | 1 | 0 | 1 |
| Row (01) | 0 | 1 | 0 | 1 |
| Row (00) | 0 | 0 | 0 | 1 |

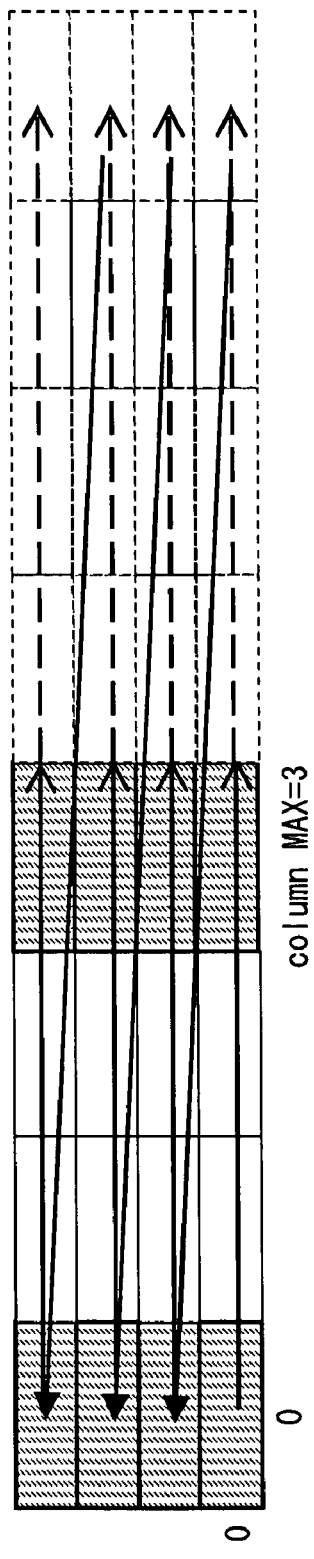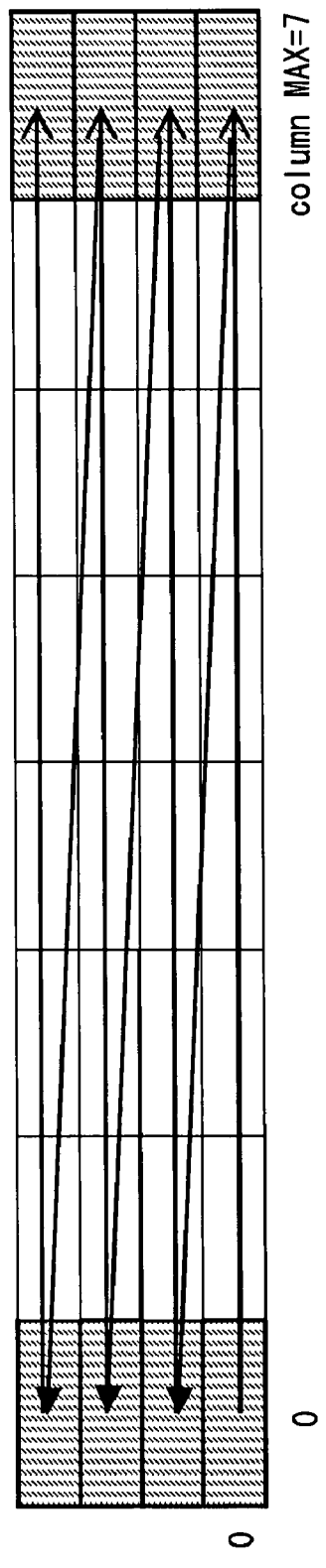

SEMICONDUCTOR INTEGRATED CIRCUIT, BIST CIRCUIT, DESIGN PROGRAM OF BIST CIRCUIT, DESIGN DEVICE OF BIST CIRCUIT AND TEST METHOD OF MEMORY

BACKGROUND OF THE INVENTION

1. Field of the Invention

The present invention relates to a BIST (built in self-test) circuit having a pattern generator, an address generator and a result comparator for performing an operational test of a memory, a semiconductor integrated circuit provided with the BIST circuit, a design device of the BIST circuit and a test method of a memory.

2. Description of Related Art

In order to facilitate a test of a system LSI (Large Scale Integration) internal circuit such as a RAM (Random Access Memory) block, a built in self-test (BIST) for performing such test by a circuit itself included in the LSI is used. This is the technique of embedding a pattern generator, an address generator and a result comparator in a chip. In generation of a test pattern, algorithm called marching or checkerboard is often used. In a memory BIST, a memory can be tested by reading out data written to the RAM block and comparing the result. As a semiconductor integrated circuit mounted with a BIST circuit of a related art, the following circuits are known.

FIG. 23 is a block diagram showing a semiconductor integrated circuit disclosed in Japanese Unexamined Patent Application Publication No. 2000-163993 (Sakamoto). As shown in FIG. 23, the semiconductor integrated circuit disclosed by Sakamoto includes 2 memory circuit units 161 and 162 with different configuration of data bit width and address bit width and one BIST circuit 105 for performing a test of the memory circuit units 161 and 162. An address each with specific bit width, access signal and a refresh signal are independently connected to the memory circuit units 161 and 162 from the BIST circuit unit 105, test data generated in the BIST circuit unit 105 is connected to the memory circuit units 161 and 162 by the same data input line, and data read out from the memory circuit units 161 and 162 is connected independently to the BIST circuit unit 105 by a data output line each with specific bit width.

The memory circuit unit 161 includes a memory circuit 121, an address access signal multiplex 111 and a data multiplex 131. The memory circuit unit 162 includes a memory circuit 122, an address access signal multiplex 112 and a data multiplex 132. The memory circuit unit 162 differs from the memory circuit unit 161 in the structure of data bit width and address bit width.

An address access signal generation circuit 102 of the BIST circuit unit 105 has an address bit width which can generate an address value of the larger one in the maximum address value of the memory circuit units 161 and 162 and is able to generate the same address and access signal to the memory circuit units 161 and 162. A data generation circuit 103 can generate a data bit width of the larger one in the memory circuit units 161 and 162 and generates the same test data to the memory circuit units 161 and 162.

The memory circuit unit maximum address memory circuit 106 stores the maximum address value of the memory circuit units 161 and 162 respectively. The address determine circuit 107 determines that an address generated by the address access signal generation circuit 102 is more than the address set by the memory circuit unit maximum address memory circuit 106 for each of the memory circuit units 161 and 162 and independently generates a refresh operation signal of the memory circuit units 161 and 162.

Address access signal control circuits 181 and 182 respectively disable the address and the access signal generated by the address access signal generation circuit 102 by the refresh operation signal of the memory circuit units 161 and 162 which is generated by the address determine circuit 107. Refresh generation circuits 191 and 192 respectively generate a refresh signal of the memory circuit units 161 and 162 by the refresh operation signal of the memory circuit units 161 and 162 generated by the address determine circuit 107. Comparison circuits 141 and 142 respectively compare read-out data of the memory circuit units 161 and 162 with expected values generated by the data generation circuit 103 and output a result at an enable time and output a matching result at a disable time.

Data comparison signal control circuits 143 and 144 respectively disable the comparison circuits 141 and 142 of the memory circuit units 161 and 162 by the refresh operation signal of the memory circuit units 161 and 162 generated by the address determine circuit 107. The BIST control circuit 101 controls the address access signal generation circuit 102, the data generation circuit 103 and the data comparison signal control circuits 143 and 144 according to a test algorithm, tests the memory circuit units 161 and 162 and outputs an existence of an error in the memory circuit units 161 and 162 from the comparison result returned by the comparison circuits 141 and 142.

In this way, one BIST circuit 105 is shared by a plurality of memories (DRAM) 121 and 122 with different size. Address access of each memory 121 and 122 is controlled by the address determine circuit 107 using the maximum address memory circuit 106 for storing the maximum address of each memory 121 and 122. When testing the memories 121 and 122 in parallel, if distinguished as a nonexistence address in a certain memory, address access and an output comparison are disabled and a refresh signal is sent to the memory to stop the test operation.

FIG. 24 is shows a semiconductor integrated circuit disclosed in Japanese Unexamined Patent Application Publication No. 2000-111618 (Ida). As shown in FIG. 24, a BIST circuit disclosed by Ida tests 16 bits×16K word memory 202B and 8 bits×1K word memory 202C. The BIST circuit is mounted to the same LSI as the memories 202B and 202C and includes a BIST sub circuit 201 and 2 data input circuits 204 and data output circuits 205 that each of them corresponds to the memories 202B and 202C.

The BIST sub circuit 201 outputs representative 1 bit data to 2 data input circuits 204. The BIST sub circuit receives representative 1 bit data and degenerate 1 bit data from the 2 data output circuits 205 and transmits address signals 220 and a control signal group to 2 memories 202B and 202C. This transmission is performed through a bus 230, and in response to a select signal, a decoder circuit 203 outputs an enable signal to only one of the 2 memories 202B and 202C in order to activate.

The data input circuits 204 are provided to each of the memories 202B and 202C and generate positive phase test bit data and negative test bit data from representative 1 bit data 213 input from the BIST sub circuit 201 to write to the corresponding memory. The total number of bits of test bit data 216 is equal to the number of bits per word of the corresponding memory. Therefore, it is 16 bits for the memory 202B and 8 bits for the memory 202C.

The data output circuits 205 are also provided to each of the memories 202B and 202C and read out test bit data 218 corresponding to the test bit data 216 from the corresponding memory. Then, degenerate 1 bit data 215 is generated and output to the BIST sub circuit 201. This degenerate 1 bit data 215 indicates a difference of the representative 1 bit data 213 from the test bit data 218.

When receiving representative 1 bit data, the BIST sub circuit 201 can test the memories 202B and 202C by comparing with the representative 1 bit data 213 from the difference. Moreover, when receiving the degeneration 1 bit data 215, the BIST sub circuit 201 can test the memories 202B and 202C by knowing the difference from representative 1 bit data according to whether it is "1" or "0".

As described above, in the BIST circuit disclosed by Ida, for a plurality of memories 202B and 202C with different size, the portion that can be shared as a test circuit is packed as the BIST sub circuit 201 and the test data input circuits 204 and the output circuits 205 which are specific to each memory are prepared separately. Moreover, the decoder 203 is provided to select each memory to test in serial.

FIG. 25 is a block diagram showing a semiconductor integrated circuit disclosed in Japanese Unexamined Patent Application Publication No. 2002-358797 (Yoshizawa). As shown in FIG. 25, a BIST circuit disclosed by Yoshizawa includes an address generator 303, a test mode control & data generator 301, a RAM interface block 309 and a comparator 310.

The test mode control & data generator 301 controls test mode and generates test data. The test mode controller 301 inputs a clock, a reset (RST) and a test mode switching signal and outputs a test mode signal, a data signal, an ascending/descending order specification signal and a last value.

The test mode switching signal is created by a logical sum taken by an OR gate 302 between a count stop signal 308a and an address counter initializing signal 312 that are output by the address generator 303. The address generator 303 inputs a CLK, a RST, the address counter initializing signal 312, a test mode signal 319, an ascending/descending order specification signal 301b output from the test mode controller 301, an address last value specification signal (last value) 301a and a count trigger signal 301d and outputs a X address (row address) and a Y address (column address).

The RAM interface block 309 inputs a X address 318, a Y address 317, a test mode, data, a CLK and a RST and outputs RAM input command address input data corresponding to the interface specification of a RAM to be tested from these inputs.

The comparator 310 compares testing RAM output data with expected value data (data) and outputs the comparison result. The address generator 303 is formed by an address counter 304, an address modulation circuit 305, a testing subarray specification circuit 306, an address scrambler 307 and a count last value detection circuit 308.

An address counter 304 inputs the RST, the count trigger signal 301d, the ascending/descending order specification signal 301b, and the count stop signal 308a output from the count last value detection circuit 308 and outputs an address (counter) count value 304a.

The count last value detection circuit 308 inputs the last value 301a output from the test mode controller 301 and the count value 304a output from the address counter 304 and, outputs the count stop signal 308a.

The address modulation circuit 305 inputs the address (counter) 304a output from the address counter 304, the test mode signal 319 and a modulation control from the test mode controller and outputs an (modulated) address 305a. The testing subarray specification circuit 306 inputs the (modulated) address 305a output from the address modulation circuit 305 and the test mode signal 319 and outputs an address (Y address (subarray specified), X address (subarray specified)).

The address scrambler 307 inputs the Y address (subarray specification) and the X address (subarray specification) and outputs a Y address 317 and a X address 318. Moreover in this embodiment, the test mode signal, the X address 317 and the Y address 318 are output to a memory 311 through the RAM interface block 309.

As described above, in a semiconductor integrated circuit disclosed by Yoshizawa, in a test circuit for one memory 311, the address modulation circuit 305 and the testing subarray specification circuit 306 are connected to the counter 304 which can generate an address in ascending and descending order and by specifying a test mode, a test pattern of address operations other than the march test and the checkerboard test which simply test in an address ascending and descending order can be generated.

However in a test of a memory, besides failures that can be detected in a read-out test to continuous addresses, there are failures that can be detected by a read-out test to discontinuous addresses. Accordingly, by performing a data read-out test of a remote address, it is possible to provide products with higher reliability. As such test method, it can be considered to perform a test by accessing from the bottom address to the top address in a memory address. For example, as shown in FIG. 4, assuming that the bottom address (=0) and the top address (=MAX) is alternately selected for a row address, if a column address is incremented for every top address, a read-out test can be sequentially performed to memory cells of the bottom address and the top address of the row address.

In this document, for at least one of row and column address, performing a test by alternately selecting the bottom address and the top address is referred to as a boundary test. For the boundary test, there are following methods shown in FIGS. 4 to 12 described later depending on the method of address selection. Moreover, the top address and the bottom address in a row and a column are collectively referred to as a boundary address. A cell having a boundary address in at least one of a row or a column address is referred to as a boundary cell. That is, the test between boundary cells is referred to as a boundary test.

The semiconductor integrated circuit disclosed by Sakamoto is able to perform a test to a plurality of memories (DRAM) with different size by the shared BIST. However, in such case, it may be the state of accessing a nonexistence address in either of the memory with smaller size. In such case, the test operation must be stopped by disabling an address access and storing a refresh signal into the memory. Therefore, in a memory with small size, the continuity of address change disappears and the boundary test of address cells cannot be performed. In order to compensate this, it is necessary to perform a test separately, thereby increasing the test time.

Moreover, in the semiconductor integrated circuit disclosed by Ida, each memory is assumed to be tested in serial although the BIST is shared. Accordingly, the test time is the total test time of each memory and there is a problem that the test time is long. Furthermore, it is not possible to perform a test that carries out only the address boundary test.

Furthermore, the semiconductor integrated circuit disclosed by Yoshizawa does not have the mechanism of sharing a BIST circuit among a plurality of memories and a BIST circuit is prepared for each memory. Therefore, to a plurality of memories with different size, it is not possible to generate a test pattern including an address cell boundary test in parallel. Moreover, the overhead of area is large.

As described above, as for Sakamoto and Ida, a circuit for generating a test pattern other than incrementing or decrementing an address is not included. We have now discovered that for this reason, when testing a plurality of memories with different size, a pattern for testing only between address cell boundaries cannot be generated and the boundary portion cannot be tested sufficiently. Moreover, even when testing between address cell boundaries that can be performed by the march test and the checkerboard test, the test time increases. Furthermore, we have also discovered that as for the technique disclosed by Yoshizawa, there is no circuit included such as an address MAX value memory circuit and an address check circuit for a memory in order to share a test circuit among the plurality of memories to test in parallel.

SUMMARY

In one embodiment, a semiconductor integrated circuit includes a memory and a BIST circuit to test the memory, the BIST circuit including a boundary address generation circuit to generate a row address pattern or a column address pattern of the memory and at least one of the row address pattern or the column address pattern of a memory having alternative a top address and a bottom address.

In another embodiment, a BIST circuit includes an address generation unit to generate an address pattern for a boundary test to perform an access test to a boundary cell including at least a row or a column address including a top address or a bottom address and an expected value checking unit to check test data read out from the memory with an expected value. The address generator generates the row or the column address pattern of the memory and for at least one of the row address pattern or the column address pattern, the top address and the bottom address are alternated.

In the present invention, the boundary address generation circuit or an address generator is included for generating a row address pattern or a column address pattern of a memory and a top address and a bottom address of the memory are alternately generated for at least one of the row address pattern or the column address pattern. Thus, for a boundary cell including at least one of a row address or a column address having a top address or a bottom address, a write or a read failure test can be performed by writing or reading data to/from the boundary cell.

In another embodiment, a design program product of a BIST circuit to execute a certain operation includes selecting a pattern of a BIST circuit, the BIST circuit being able to perform a boundary test to conduct an access test for a boundary cell including at least one of a row or a column address pattern of a memory having a alternative a top address and a bottom address and generating a BIST circuit using the pattern.

In another embodiment, a design device of a BIST circuit includes a data input unit to input the number and a size of a memory and a BIST circuit generation unit to generate a BIST circuit using data input from the data input unit and a pattern of a BIST circuit, where the BIST circuit is able to perform a boundary test to conduct an access test for a boundary cell including at least one of a row or a column address of a memory having a top address or a bottom address.

In the present invention, as the BIST circuit is designed using the pattern of the BIST circuit that can perform an access test to a boundary cell, the obtained BIST circuit is able to perform a write or a read failure test for a boundary cell of a memory.

In another embodiment, a method of testing a memory includes accessing a boundary cell including at least one of a row or a column address of a memory having a top address or a bottom address and reading out data from the boundary cell to check with an expected value.

In the present invention, for a boundary cell including at least a row address or a column address having a top address or a bottom address, a read failure test can be performed.

According to the present invention, for a boundary cell in which at least one of a row and a column address is the bottom address or the top address, a test can be performed efficiently and a memory with high reliability and a semiconductor integrated circuit mounted with the memory can be provided.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3A is a pattern diagram showing a memory address cell structure;

FIG. 3B is shows test write-in data;

Similarly.

Similarly.

Similarly.

Similarly.

Similarly.

Similarly.

Similarly.

Similarly.

FIG. 14A explains the structure of a memory cell;

FIG. 14B explains an operation of the boundary test shown in FIG. 4;

FIG. 16A shows the structure of a memory cell;

FIG. 16B explains an operation of the boundary test shown in FIG. 12;

FIG. 19A shows an access method to a memory A at the time of testing in a column direction and address ascending order in parallel with the circuit configuration of FIG. 18;

FIG. 19B shows an access method to a memory B at the time of testing in a column direction and address ascending order in parallel with the circuit configuration of FIG. 18;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, detailed embodiment incorporating the present invention is described with reference to the drawings. This embodiment incorporates the present invention to a memory test circuit that is able to test an address cell boundary and a method thereof. As stated above, performing a test by alternately selecting the bottom and the top address for at least one of a row and a column address is referred to as a boundary test in this document. Moreover, the top address and the bottom address in a row and a column, that is an address in a memory cell boundary, are collectively referred to as a boundary address. A cell having a boundary address in at least one of a row or a column address is referred to as a boundary cell.

In the test method according to this embodiment, there is a method of generating a test pattern for testing a data Read failure only between boundary cells to perform a test. Accordingly, this method is realized by providing an address generator which can alternately generate the top address and the bottom address in either or both of a row and a column address pattern. Moreover, when performing a parallel test by a BIST shared by a plurality of memories with different size, in an address cell boundary test mode, a circuit is provided which converts an address value of the top side generated by the abovementioned address generator into the top address for each memory. This enables to test only an address cell boundary regardless of memory size. Furthermore, it is possible to attempt to shorten the memory test time by generating an address cell boundary test pattern and also to generate a boundary test pattern of a pattern that cannot be tested by the march test or the checkerboard test.

First Embodiment

Figure 1:
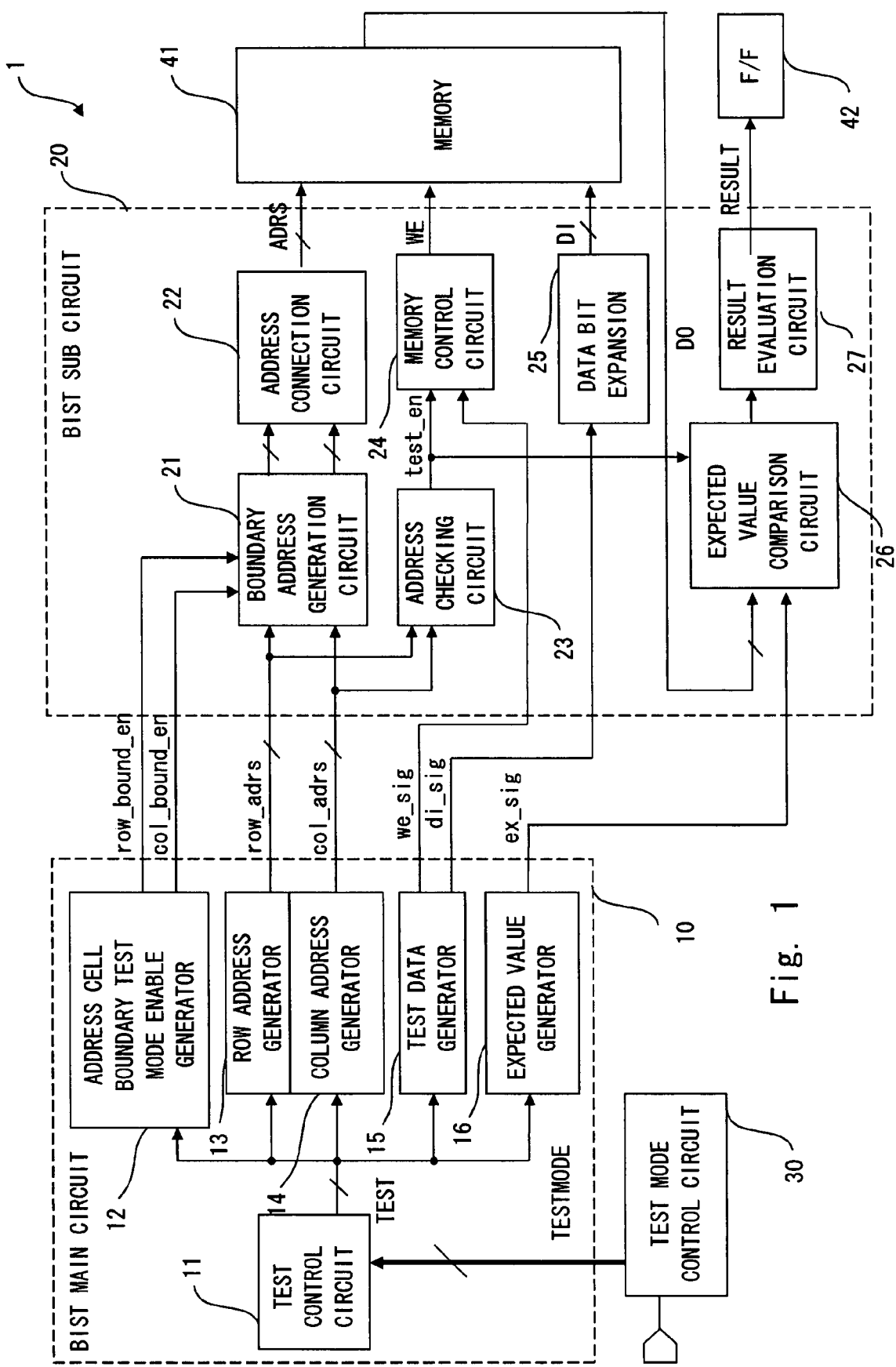
FIG. 1 is a block diagram showing a test circuit according to a first embodiment of the present invention.

Hereinafter, a first embodiment of the present invention is described in detail. FIG. 1 is a block diagram showing a test circuit according to this embodiment. A test circuit 1 according to this embodiment includes a BIST main circuit 10, a BIST sub circuit 20 and a test mode control circuit 30. This test circuit 1 is able to share the BIST main circuit 10 with a plurality of memories. One memory 41 is shown in FIG. 1.

One test mode control circuit 30 is prepared for one chip and supplies a test mode to the BIST main circuit for specifying a test to perform such as the march test, the checkerboard test or an address cell boundary test, which is a test between boundary addresses.

One BIST main circuit 10 is prepared for a plurality of memories that shares a BIST. This BIST main circuit 10 includes a test control circuit 11, an address cell boundary test mode enable generator 12, a row address generator 13, a column address generator 14, a test data generator 15 and an expected value generator 16.

The test control circuit 11 outputs a TEST signal for controlling the circuits in each BIST main circuit 10 based on the test mode received from the test mode control circuit 30. The address cell boundary test mode enable generator 12 generates an enable signal in case of performing an address cell boundary test. That is, in response to a TEST signal indicating of an address cell boundary test from the test control circuit 11, the enable signal is enabled. In response to a TEST signal indicating of the march test or the checkerboard test, the enable signal is disenabled.

Moreover, the row/column address generators 13 and 14, the test data generator 15 and the expected value generator 16 respectively generate an address, data and an expected value corresponding to a TEST signal value. For example, the test data generator 15 generates a marching pattern for the march test, a checkerboard pattern for the checkerboard test and a boundary address test pattern for a boundary test. Similarly, the row/column address generators 13 and 14 generate an ascending or a descending address pattern for the march test or the checkerboard test and for a boundary test, combine an address generated by a boundary address generator circuit 21 described later so as to generate an address for testing the boundary address shown in FIGS. 4 to 12 described later.

The BIST sub circuit 20 is prepared for each memory 41. This BIST sub circuit 20 includes the boundary address generation circuit 21, an address connection circuit 22, an address checking circuit 23, a memory control circuit 24, a data BIT expansion circuit 25, an expected value comparison circuit 26 and a result evaluation circuit 27. In the address cell boundary test mode, based on the address output from the abovementioned address generators 13 and 14, the boundary address generation circuit 21 alternately generates a top address value and a bottom address value to output for either or both of row/column address. Moreover, in the mode of the march test or the checkerboard test, an address value in an ascending or a descending order output from the address generators 13 and 14 is output as it is. The details of this boundary address generation circuit 21 are described later.

In response to the row/column address value output from the boundary address generation circuit 21, the address connection circuit 22 outputs an ADRS signal which connected the row/column address value for inputting into a memory. The address checking circuit 23 compares the row/column size of a target memory for the BIST sub circuit with a row_adrs and a col_adrs signals and if they are more than the memory size, the address checking circuit 23 outputs a WE signal and a test_en signal for controlling not to perform an expected value comparison. This enables to test a plurality of memories with different size in parallel.

The data BIT expansion circuit 25 expands a 1 bit di_sig signal to the BIT width of the target memory. The memory control circuit 24 outputs a WE signal from the test_en signal and a we_sig signal input. The expected value comparison circuit 26 compares DO of a memory output with an ex_sig signal and outputs a result to the result evaluation circuit 27. The result evaluation circuit 27 evaluates whether there is a failure in the target memory from the expected value comparison result. The result evaluation circuit 27 outputs its result to Flip-Flop (F/F) 42.

Figure 2:
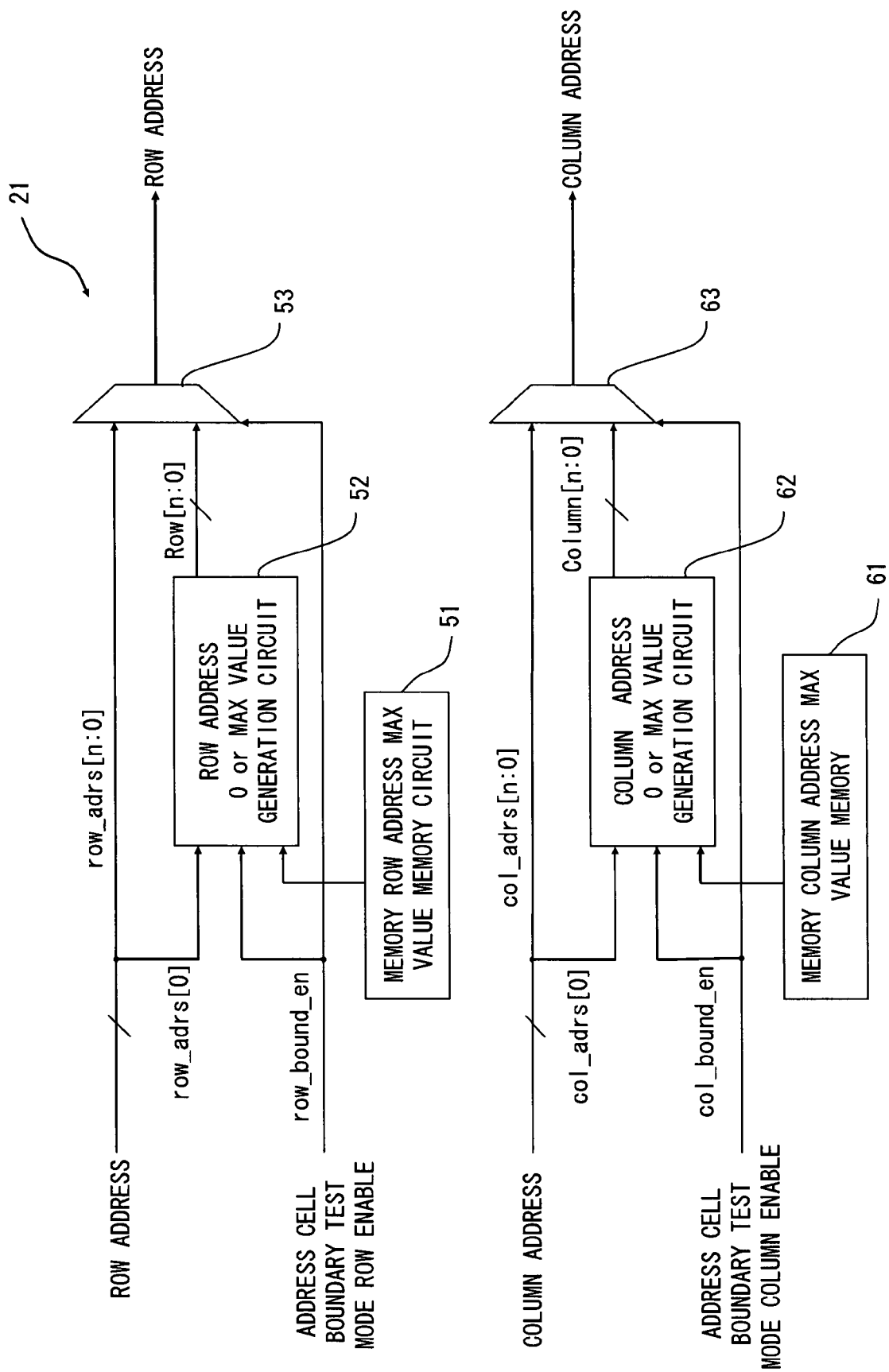
FIG. 2 is a block diagram showing a detailed example of a boundary address generation circuit in the test circuit according to the first embodiment of the present invention.

FIG. 2 is a block diagram showing a detailed example of the boundary address generation circuit. The boundary address generation circuit 21 includes a memory row address MAX value memory circuit 51, a memory column address MAX value memory circuit 61, a row address 0 or MAX value generation circuit 52, a column address 0 or MAX value generation circuit 62 and selectors 53 and 63.

This boundary address generation circuit 21 is provided in the BIST sub circuit 20 and accordingly is provided for each target memory. The memory row address MAX value memory circuit 51 and the memory column address MAX value memory circuit 61 store a row address MAX value (the top address of a row address) and a column address MAX value (the top address of a column address) of the target memory.

The row/column address 0 or MAX value generation circuits 52 and 62 output the bottom address (=0) or a MAX value according to an input from the row/column address if row_bound_en and a col_bound_en signal of the address cell boundary test mode enable are enabled. For example, when the row_bound_en signal is enabled in the boundary test mode and a least significant bit row_adrs [0] of an input row address is "0", "0" is output and when the least significant bit is "1", the MAX value is output. When it is not the address cell boundary test mode, the row_bound_en and the col_bound_en signal are disenabled and the selectors 53 and 63 output the input row/column address row_adrs/col_adrs as they are. The details of the operation of the boundary address generation circuit 21 are described later.

Firstly a boundary address generated in the test circuit according to this embodiment is explained here. FIG. 3A is a pattern diagram showing the memory address cell structure and FIG. 3B shows test write-in data. For the ease of explanation, this address cell is explained to be an address cell structure of a memory used for an address cell boundary test shown in FIGS. 4 to 12.

As shown in FIG. 3A, the lengthwise direction of the address cell structure is to be row and the horizontal direction is to be column. The memory includes four cells (for example, Adrs0-Adrs3) in the column direction and four cells (for example, Adrs0, 3, 8, 12) in the row direction. FIG. 3B shows the data writing state of the checkerboard test described later. By the checkerboard test, the data of "01" is written alternately.

Figure 4:
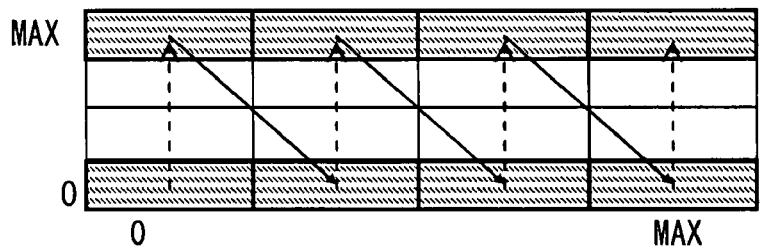
FIG. 4 shows an example of an address cell boundary test performed in the test circuit according to the first embodiment of the present invention and also shows an access method to an address structure and a memory.

When performing a boundary test to such memory cell, there is a test method as shown in FIGS. 4 to 12. Firstly, FIG. 4 shows a Read failure test of an address cell boundary in which a column address pattern is changed to increment operation and a row address pattern is changed from 0 to MAX (up). As shown in FIG. 4, the row address pattern is changed by turns of 0 and a MAX value and the column address pattern is incremented whenever the row address becomes 0 (the bottom address). It becomes a test pattern which performs only pattern operation of the boundary address portion included in the march test and the checkerboard test of the address ascending order in the row direction.

Figure 5:
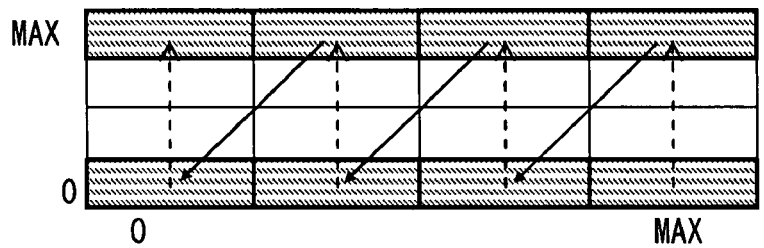
FIG. 5 shows an example of an address cell boundary test performed in the test circuit according to the first embodiment of the present invention and also shows an access method to an address structure and a memory.

FIG. 5 shows a Read failure test of an address cell boundary in which a column address pattern is changed to decrement operation and a row address pattern is changed from 0 to MAX (up). As shown in FIG. 5, the row address pattern is changed by turns of 0 and a MAX value and the column address pattern is decremented whenever the row address becomes 0. This address cell boundary test pattern is a test pattern not existing in the march test and the checkerboard test.

Figure 6:
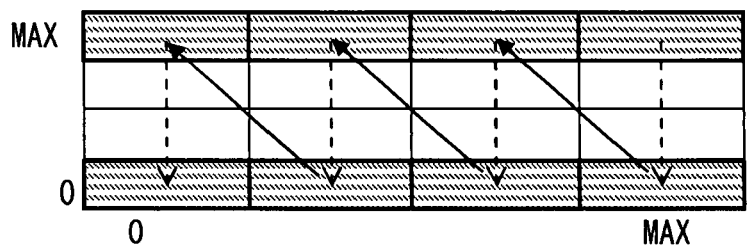
FIG. 6 shows an example of an address cell boundary test performed in the test circuit according to the first embodiment of the present invention and also shows an access method to an address structure and a memory.

Next, FIG. 6 shows a Read failure test of an address cell boundary in which a column address pattern is changed to decrement operation and a row address pattern is changed from MAX to 0 (down). As shown in FIG. 6, the row address pattern is changed by turns of a MAX value and 0 and the column address pattern is decremented whenever the row address becomes the MAX value. It becomes a test pattern which performs only pattern operation of the address cell boundary portion included in the march test and the checkerboard test of the address descending order in the row direction.

Figure 7:
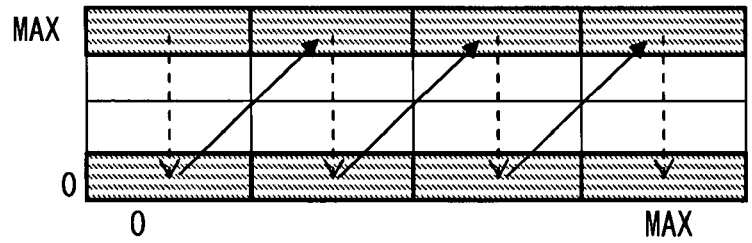
FIG. 7 shows an example of an address cell boundary test performed in the test circuit according to the first embodiment of the present invention and also shows an access method to an address structure and a memory.

Then, FIG. 7 shows a Read failure test of an address cell boundary in which a column address pattern is changed to increment operation and a row address pattern is changed from MAX to (down). As shown in FIG. 7, the row address pattern is changed by turns of a MAX value and 0 and the column address pattern is incremented whenever the row address becomes the MAX value. This address cell boundary test pattern is a test pattern not existing in the march test and the checkerboard test.

Figure 8:
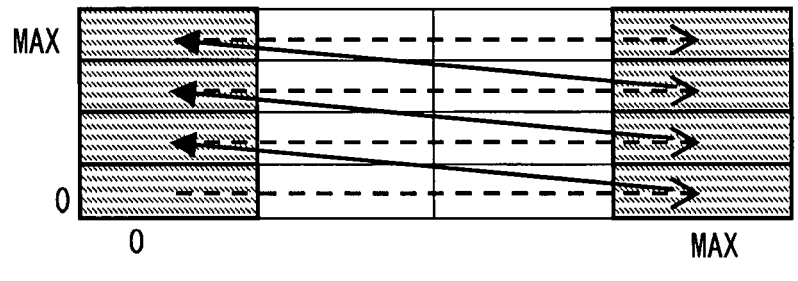
FIG. 8 shows an example of an address cell boundary test performed in the test circuit according to the first embodiment of the present invention and also shows an access method to an address structure and a memory.

FIG. 8 shows a Read failure test of an address cell-boundary in which a row address pattern is changed to increment operation and a column address pattern is changed from 0 to MAX (up). As shown in FIG. 8, the column address pattern is changed by turns of 0 and a MAX value and the row address pattern is incremented whenever the column address becomes 0. It becomes a test pattern which performs only pattern operation of the address cell boundary portion included in the march test and the checkerboard test of the address ascending order in the column direction.

Figure 9:
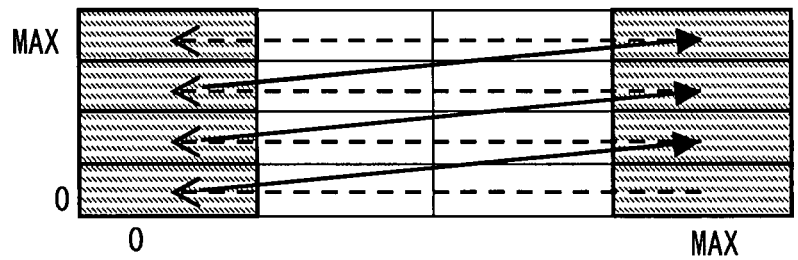
FIG. 9 shows an example of an address cell boundary test performed in the test circuit according to the first embodiment of the present invention and also shows an access method to an address structure and a memory.

FIG. 9 shows a Read failure test of an address cell boundary in which a row address pattern is changed to increment operation and a column address pattern is changed from MAX to 0 (down). As shown in FIG. 9, the column address pattern is changed by turns of a MAX value and 0 and the row address pattern is incremented whenever the column address becomes the MAX value. This address cell boundary test pattern is a test pattern not existing in the march test and the checkerboard test.

Figure 10:
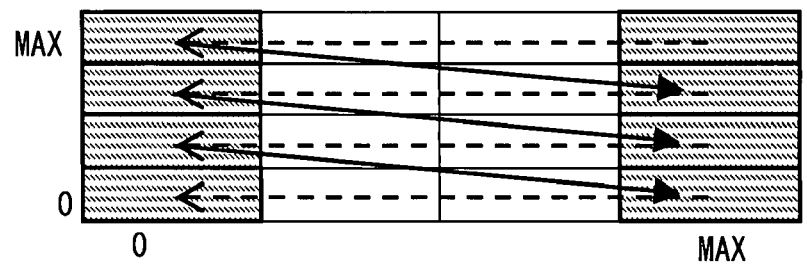
FIG. 10 shows an example of an address cell boundary test performed in the test circuit according to the first embodiment of the present invention and also shows an access method to an address structure and a memory.

FIG. 10 shows a Read failure test of an address cell boundary in which a row address pattern is changed to decrement operation and a column address pattern is changed from MAX to 0 (down). As shown in FIG. 10, the column address pattern is changed by turns of a MAX value and 0 and the row address pattern is decremented whenever the column address becomes the MAX value. It becomes a test pattern which performs only pattern operation of the address cell boundary portion included in the march test and the checkerboard test of the address descending order in the column direction.

Figure 11:
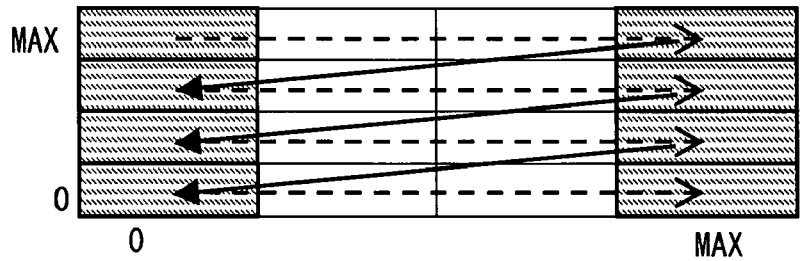
FIG. 11 shows an example of an address cell boundary test performed in the test circuit according to the first embodiment of the present invention and also shows an access method to an address structure and a memory.

FIG. 11 shows a Read failure test of an address cell boundary in which a row address pattern is changed to decrement operation and a column address pattern is changed from 0 to MAX (up). As shown in FIG. 11, the column address pattern is changed by turns of 0 and a MAX value and the row address pattern is decremented whenever the column address becomes 0. This address cell boundary test pattern is a test pattern not existing in the march test and the checkerboard test.

Figures 12, 13:
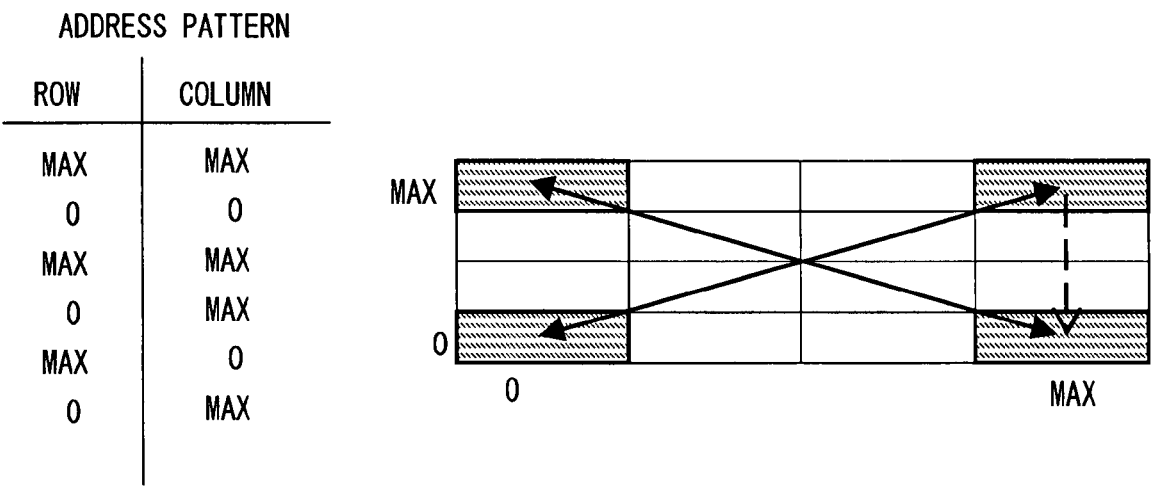
FIG. 12 shows an example of an address cell boundary test performed in the test circuit according to the first embodiment of the present invention and also shows an access method to an address structure and a memory.
FIG. 13 shows another address pattern which can perform a similar boundary test as FIG. 12.

FIG. 12 shows a test pattern of performing a Read failure test of an address cell boundary in the diagonal direction of the 4 corners in an address cell structure of a memory. The operation between the boundary addresses of a row address "0" and a column address "0" (hereinafter referred to as (row, column)=(0,0)) and (row, column)=(MAX, MAX) is made possible by repeating an address ascending or descending operation of the march test and the checkerboard test for 2 times. Operations in boundary addresses of (row, column)=(0, MAX) and (row, column)=(MAX, 0) is a test pattern that cannot be performed by the march test or the checkerboard test. FIG. 13 shows another address pattern that can perform the same boundary test as FIG. 12.

Next, the operation of the boundary address generation circuit 21 shown in FIG. 2 is explained. Here, a case of generating a boundary address pattern shown in FIGS. 4 to 12 is explained as an example. Firstly, FIGS. 14A, 14B and 15 explain a generation of the boundary address pattern shown in FIG. 4. Here, as shown in FIG. 14A, both a row address and a column address shall be 2 bits and indicated as in row (00) and column (00). Moreover, an address specified by row (ab) and column (cd), for example, shall be indicated as ADRS_x (abcd). In this case, ADRS_0 to ADRS_f, which is (0000) to (1111) are an address ADRS generated in the address connection circuit 22.

Thus, when a memory cell is made up of 16 memory cells, the row address is made up of row (00) to row (11) and a column address is made up of column (00) to column (11), the address ADRS is made up of ADRS_0 (0000) to ADRS_f (1111).

Figure 15:
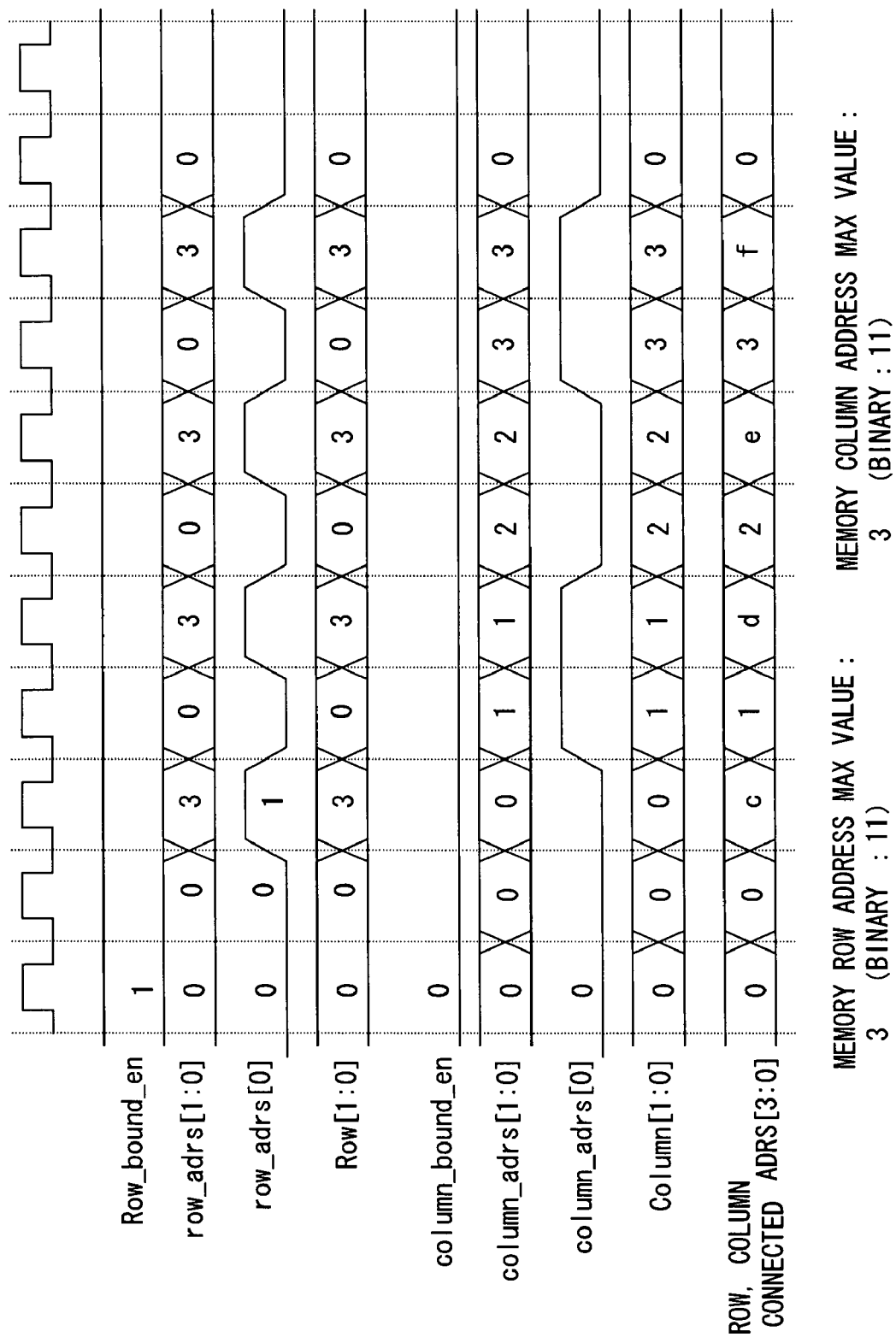
FIG. 15 is a timing chart of a boundary address generation circuit for performing the boundary test shown in FIG. 4.

Then, as shown in FIG. 14B, the address cell boundary test shown in FIG. 4 performs a Read operation between boundary addresses in an order shown by the arrows in FIG. 14B from (row, column)=(0, 0). FIG. 15 is a timing chart of this Read operation test. In this case, when an address cell boundary test mode row enable signal (row_bound_en) becomes High (enabled), the row address 0 or MAX value generation circuit 52 generates 0 or a MAX value corresponding to a row address signal (row_adrs), and outputs to the selector 53. A least significant bit (row_adrs [0]) is input into this row address 0 or MAX value generation circuit 52 among row address signal row_adrs (=row_adrs [1:0]) from the row address generator 13. Moreover, a MAX value of a corresponding memory, which is a row MAX value (11) this example, is input from the memory row address MAX value memory circuit 51.

Then, when the address cell boundary test mode row enable signal row_bound_en is enabled, the row address 0 or MAX value generation circuit 52 outputs "0" if the least significant bit row_adrs [0] of a row address is "0" and outputs the MAX value=row MAX value (11) if the least significant bit row_adrs [0] is "1". The row address generator 13 generates such row address signal row-adrs [1:0] so that least significant bit row_adrs [0] may be the data alternately including "0" and "1". Here, [n−1:0] indicates a signal of total n bits for 0 to n−1 bit. That is, ADRS [3:0] indicates a 4 bits signal from 0 to a third bit.

The selector 53 is input with the row address signal row_adrs [n:0] from the row address generator 13 and 0 or the MAX value generated in the row address 0 or MAX value generation circuit 52 and selectively outputs either of them according to the address cell boundary test mode row enable signal row_bound_en. When the address cell boundary test mode row enable signal row_bound_en is enabled, 0 or the MAX value is selected and output as a row address.

From the above explanation, when the address cell boundary test mode row enable signal row_bound_en is enabled, 0 or the MAX value is output as a row address. On the other hand, at this time, the address cell boundary test mode column enable signal column_bound_en is disenabled and the selector 63 selects a column address col_adrs [n:0] generated by the column address generator 14 and outputs as a column address. The column address generator 14 generates the column addresses shown in FIG. 4, which are column (00), column (00), column (01), column (01), . . . column (11) and column (11).

In the case of the address cell boundary test shown in FIGS. 4 to 11, either the address cell boundary test mode row enable signal row_bound_en or the address cell boundary test mode column enable signal column_bound_en of the boundary address generation circuit 21 is enabled and another is disabled. Then a row address and a column address are respectively output.

Next, a case of performing the address cell boundary test shown in FIG. 12 is explained. This is a test to perform a Read failure test in the diagonal direction for address cell boundaries of 4 corners of a memory. As shown in FIG. 16B, a Read operation of the address boundary test of FIG. 12 starts from (row, column)=(MAX, MAX) and accesses to the boundary address (row, column)=(0, 0) in the diagonal lines. After that, the boundary addresses (row, column)=(MAX, 0) and (row, column)=(0, MAX) in the diagonal lines are accessed. This address cell boundary test takes only 0 or the MAX value for both of a row address and a column address. Therefore, the address cell boundary test mode row enable signal row_bound_en and the address cell boundary test mode column enable signal column_bound_en are both enabled and the row/column address 0 or MAX value generation circuits 52 and 62 read out the MAX value from the MAX value memory circuits 51 and 61.

Figure 17:
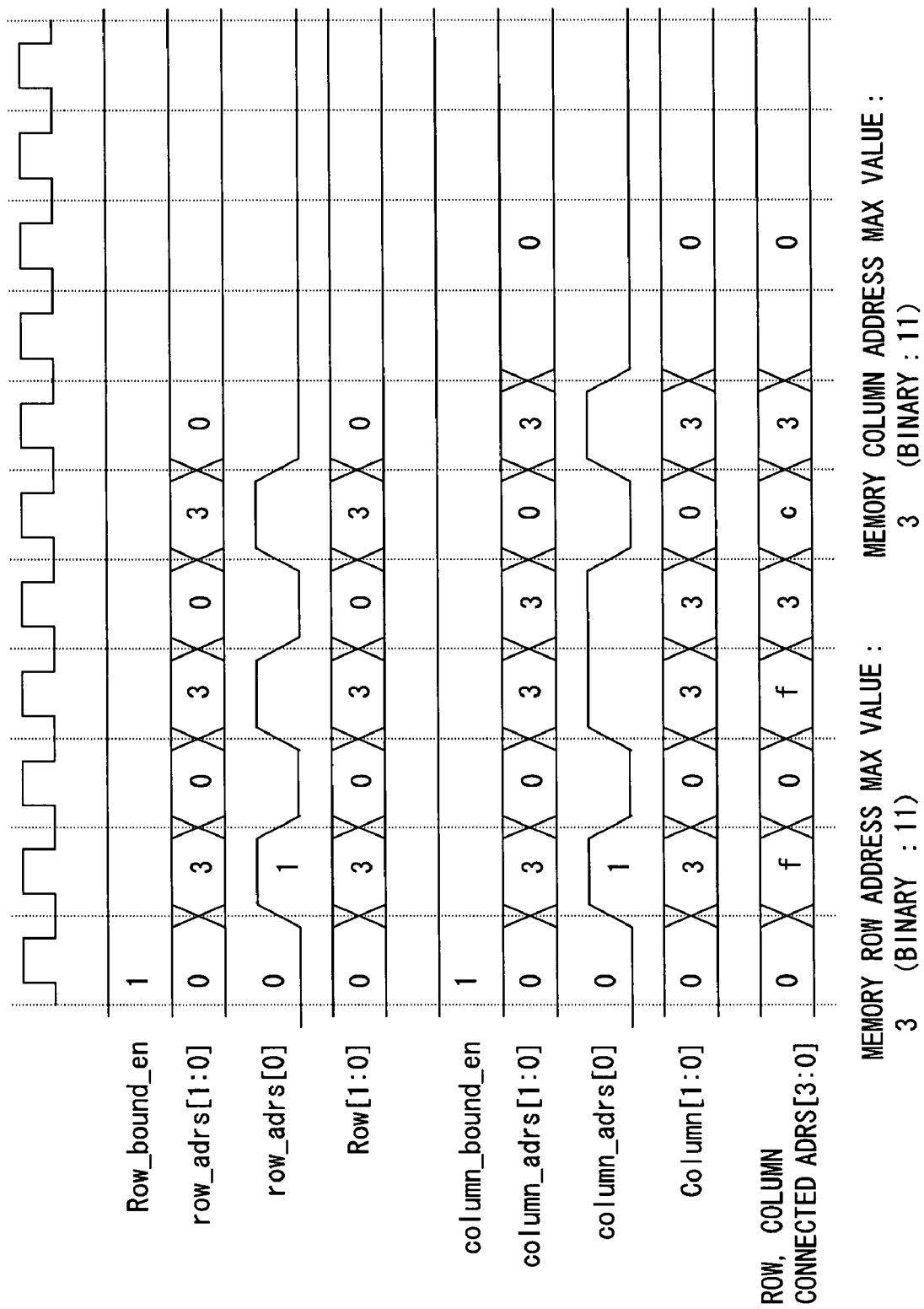
FIG. 17 is a timing chart of a boundary address generation circuit for performing the boundary test shown in FIG. 12.

Here, as shown in FIG. 17, for a row address, the least significant bit row_adrs[0] of a row address signal is input to be 010101 so that the MAX value and 0 are alternately output. Then, corresponding to this least significant bit row_adrs [0], the row address 0 or MAX value generation circuit 52 selects and outputs 0 or the MAX value (row (11)). That is, if the least significant bit row_adrs [0] is "0", "0" is output and if it is "1", the MAX value is selected and output. Since the address cell boundary test mode row enable signal row_bound_en is enabled, the selector 53 selects and outputs the output of the row address 0 or MAX value generation circuit 52.

On the other hand, for a column address, the least significant bit column_adrs[0] of a column address is input as 0101101. Corresponding to this least significant bit column_adrs [0], the column address 0 or MAX value generation circuit 62 selects and outputs 0 or the MAX value (column (11)). That is, if the least significant bit column_adrs [0] is "0", "0" is output and if it is "1", the MAX value is selected and output. Since the address cell boundary test mode column enable signal column_bound_en is enabled, the selector 63 selects and outputs the output of the column address 0 or MAX value generation circuit 62.

In this embodiment, a boundary address generation unit for generating an address cell boundary test pattern is included. Since this boundary address generation unit generates a test pattern for testing data Read failure in a cell boundary of a row address and a column address in a memory, it is possible to shorten the memory test time. Moreover, as a data Read failure between boundary addresses in a direction that cannot be tested by the march test or the checkerboard test, a higher quality test can be achieved.

In a related art, there has been no test pattern for testing only an address cell boundary. Therefore, by the march test and the checkerboard test of a related art, an address decoder between the address 0 and the address maximum (MAX) (between address cell boundary) cannot be tested. However, without testing under a difficult condition in which addresses are separated such as the address 0 and the address maximum by reading data, a memory with high reliability cannot be provided.

However in this embodiment, the pattern which tests only an address cell boundary can be generated with the boundary address generation circuit. Accordingly, since it is possible to perform a Read failure test of a address cell boundary between the address 0 and the maximum address that cannot be tested by the march test and the checkerboard test of a related art, a higher quality test can be performed.

Furthermore, corresponding to each memory, a row/column address cell boundary MAX value can be generated. Therefore, since a plurality of memories with different size can share a BIST main circuit and a data Read failure of an address cell boundary can be tested in parallel to each memory, the test time can be shortened.

Second Embodiment

Figure 18:
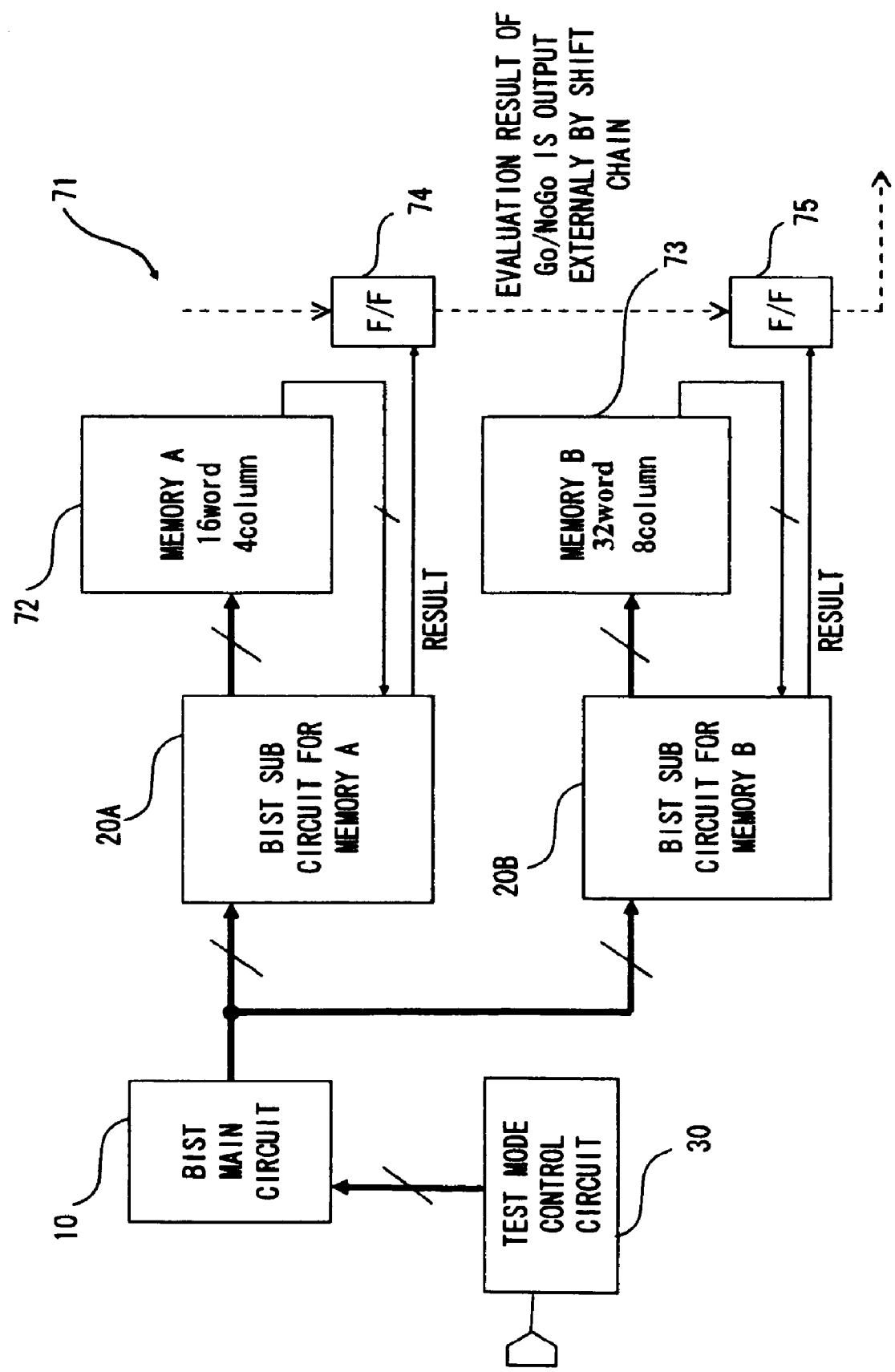
FIG. 18 shows a test circuit in case of sharing a BIST circuit with a plurality of memories and performing a test in parallel.

Next, a second embodiment is explained. FIG. 18 shows a test circuit in the case of sharing a BIST circuit with a plurality of memories to test in parallel. In a semiconductor integrated circuit according to this embodiment shown in FIG. 18, components identical to those in FIG. 1 are denoted by reference numerals identical to the semiconductor integrated circuit of the first embodiment with detailed description omitted. A semiconductor integrated circuit 71 according to this embodiment includes a memory A72, a memory B73, a BIST sub circuit 20A for memory A and a BIST sub circuit 20B for memory B corresponding to these memories, a BIST main circuit 10, a test mode control circuit 30 and flip-flops (F/F) 74 and 75.

The BIST sub circuit 20A for memory A and the BIST sub circuit 20B for memory B include the same structure as the BIST sub circuit 20 shown in FIG. 1. The BIST sub circuit 20A for memory A outputs a RESURT, which is a result of a result evaluation circuit, to the F/F 74 and the BIST sub circuit 20B for memory B outputs a RESURT, which is a result of the result evaluation circuit, to the F/F 75. The F/F74 and F/F75 output the evaluation result to outside by a shift chain. This enables to obtain an evaluation result of each memory even when tested in parallel.

An example of performing a test in the column direction and address ascending order in parallel with the circuit configuration of FIG. 18 is shown in FIGS. 19A and 19B. As in the BIST circuit of this embodiment, even if a boundary test pattern is not generated by the boundary address generation circuit and even for a test in the column direction and address ascending order, a Read test can be performed from the boundary address (row, column)=(0, 7) and the boundary address (row, column)=(1, 0) in the memory B as shown in FIG. 19B.

On the other hand, since the memories with different size are tested in parallel, as for the memory A, the boundary test corresponding to the one described above cannot be performed. That is, as the memory A is smaller than the memory B in size, an access state to a non-existing address is generated. During such access, a write operation to the memory A and an expected value comparison are not performed. Accordingly, as for the memory A, as an access to a non-existing address occurs between the boundary addresses (row, column)=(0, 3) and (row, column)=(1, 0), a boundary test cannot be performed.

Figure 20A:
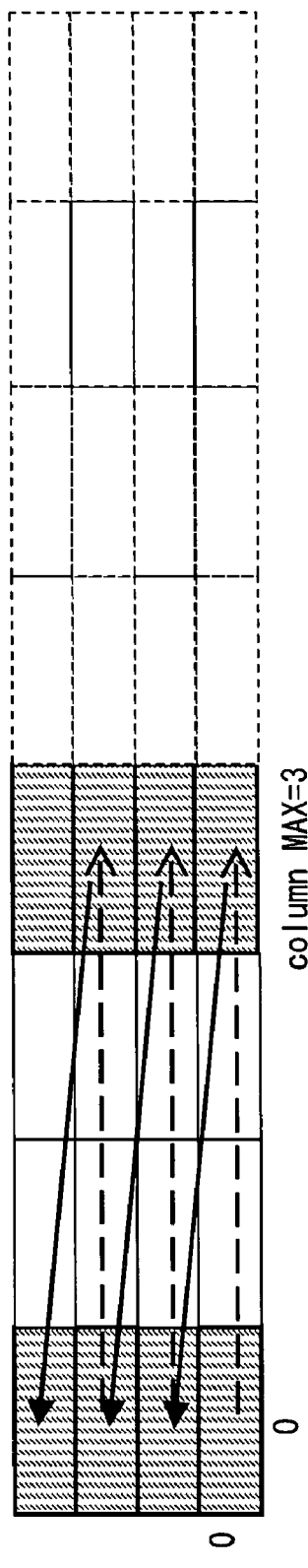
FIG. 20A shows an access method to the memory A at the time of performing an address cell boundary test in parallel using the boundary address generation circuit of the BIST circuit according to the second embodiment of the present invention.
Figure 20B:
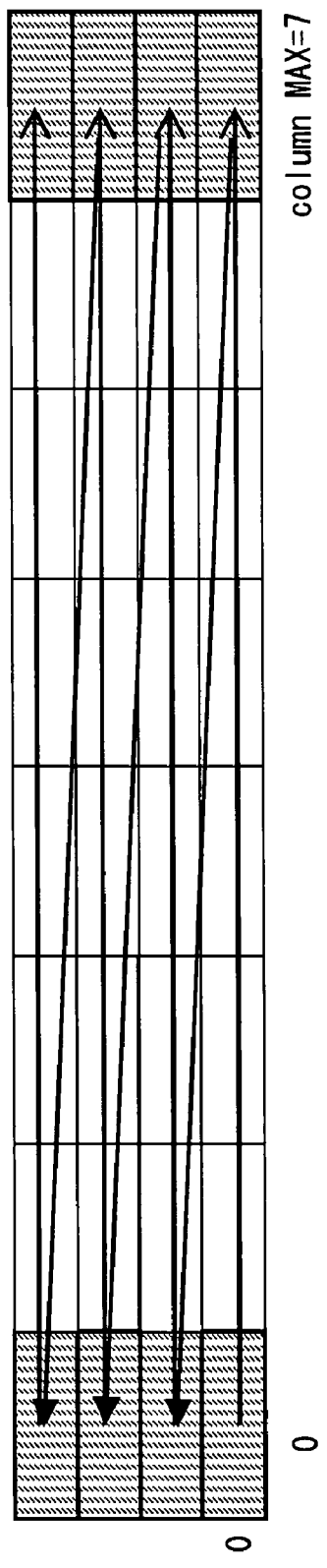
FIG. 20B shows an access method to the memory B at the time of performing an address cell boundary test in parallel using the boundary address generation circuit of the BIST circuit according to the second embodiment of the present invention.

Subsequently, an example of performing an address cell boundary test in parallel using the boundary address generation circuit of the BIST circuit according to this embodiment is shown in FIGS. 20A and 20B. The test circuit according to this embodiment includes a boundary address generation circuit for each memory and can generate a MAX value of the row/column address cell boundary corresponding to the size of each memory.

That is, the boundary address generation circuit corresponding to the memory A stores MAX=3 as a MAX value of a column address and the boundary address generation circuit corresponding to the memory B stores MAX=7 as a MAX value to read out the MAX values to generate a read-out boundary test pattern. Accordingly, a Read failure test in an address cell boundary to a plurality of memories can be performed in parallel. Thus, even for a parallel test to a plurality of memories, a test of the address cell boundary in the memory A that cannot be performed in FIG. 19 can be carried out.

In this embodiment, even in a case where the BIST main circuit 10 is shared and a test is performed in parallel to a plurality of memories, since the BIST sub circuits 20A and 20B corresponding to each memory are included to generate a boundary address corresponding to each memory, a boundary address test can be performed as with the abovementioned case. Next, the advantageous effects are explained.

In a related art, in a semiconductor integrated circuit, when sharing a BIST circuit with a plurality of memories and performing a test in parallel, in order to uniform to a memory of a large size as in FIG. 19B, to a small size memory as shown in FIG. 19A, even the test between apart of address cell boundaries that can be performed in the march test and the checkerboard test of a related art cannot be performed.

However in this embodiment, as shown in the FIG. 1, the boundary address generation circuit which can generate a row/column address cell boundary MAX value for each target memory and the address checking circuit are included. Accordingly, a test pattern which tests only an address cell boundary corresponding to each memory can be generated. That is, as shown in FIGS. 20A and 20B, even if the memory size is large or small, an address cell boundary test can be performed regardless of the memory size when testing a plurality of memories sharing a BIST in parallel.

Next, the advantageous effect of shortening the test time in the semiconductor integrated circuit according to this embodiment is explained. For example, in case of testing 16 words and 4 columns memory in serial, suppose that a diagonal address cell boundary Read test of reading "0" at the address 0 and reading "1" at the address maximum value is performed. In a related art, in order to test the diagonal address cell boundary in this address 0 and the address maximum by the checkerboard test which will be in a data writing state as shown in FIG. 3, an address ascending order Read is repeated 2 times continuously and an address descending order Read is repeated 2 times continuously in the column direction.

The memory test time in this case requires;

16 words×(address ascending order Read 2 times+ address descending order Read 2 times)=64 patterns.

Suppose that a test in which Read data "0" and "1" is reversed is also performed and it requires twice more, which is;

64 pattern×2=128 patterns.

On the other hand, when generating the address cell boundary test pattern according to this embodiment, to perform a diagonal address cell boundary Read test at the address 0 and the address maximum as with the abovementioned case, it means that the diagonal address cell boundary test shown in FIG. 12 is performed. Including the test of (row, column)=(0, MAX) and (row, column)=(MAX, 0) which is not included in the above test, even when data "0" and "1" are replaced, it can be tested by;

6 pattern×data "0"/"1" (2 times)=12 patterns.

Furthermore, the advantageous effect of shortening the test time according to this embodiment in the case of testing a plurality of memories sharing a BIST circuit is explained. For example, as shown in FIG. 18, a case is described in which a BIST circuit is shared with 16 words and 4 columns memory A and 32 words and 8 columns memory B to test in parallel.

Considering a column direction Read operation by the checkerboard test to be the data writing state as shown in FIG. 3, a parallel test is performed based on the memory B which has the size that contains the memory A, as shown in FIGS. 19A and 19B. In a method of a related art, by performing a Read test for the address ascending order 2 times, descending order 2 times and replacing the data "0" and "1", as for the memory B, the diagonal address cell boundary in the address 0 and the address maximum value in FIGS. 8, 10 and 12 can be tested. However, as shown in FIG. 19A, for the memory A, none of the address cell boundary tests can be performed. Accordingly, only the memory A must be tested in serial for the address cell boundary test separately.

Therefore, it requires 384 patterns that is a sum of the test time of the memory B which is;

32 words×(address ascending order Read 2 times+ address descending order Read 2 times)×data "0"/"1" 2 time=256 patterns and the test time of the memory A which is;

16 words×(address ascending order Read 2 times+ address descending order Read 2 times)×data "0"/"1" 2 times=128 patterns.

On the other hand, in the test circuit according to this embodiment, since an address cell boundary test pattern can be generated, the same test as the abovementioned test can be performed by performing the checkerboard test based on the memory B and the address cell boundary test shown in FIGS. 8, 10 and 12. The test time in this case can be calculated as follows. The checkerboard test of the memory B size requires;

32 words×(address ascending order Read 1 time+address descending order Read 1 time)×data "0"/"1" 2 time=128 patterns the address cell boundary test shown in FIGS. 8 and 10 requires;

(4 stages of row address cell×2 stages of column boundary−1)×data "0"/"0" 2 times)×2 kinds of tests=28 patterns and the diagonal address cell boundary test of FIG. 12 requires;

6 patterns×data "0"/"1" (2 times)=12 patterns.

Thus, it can be tested by; 128+28+12=168 patterns.

Furthermore, it is also possible to generate an address cell boundary test pattern which cannot be tested by the march test and the checkerboard test of a related art. That is, a test pattern as shown in FIGS. 5, 7, 9 and 11 can be generated as described above. Moreover, by sharing a BIST and testing a plurality of memories in parallel, for the address cell boundary test pattern, the test time is not proportional to word size and the number of memory and thereby enabling to test in a short time.

Third Embodiment

Figure 21:
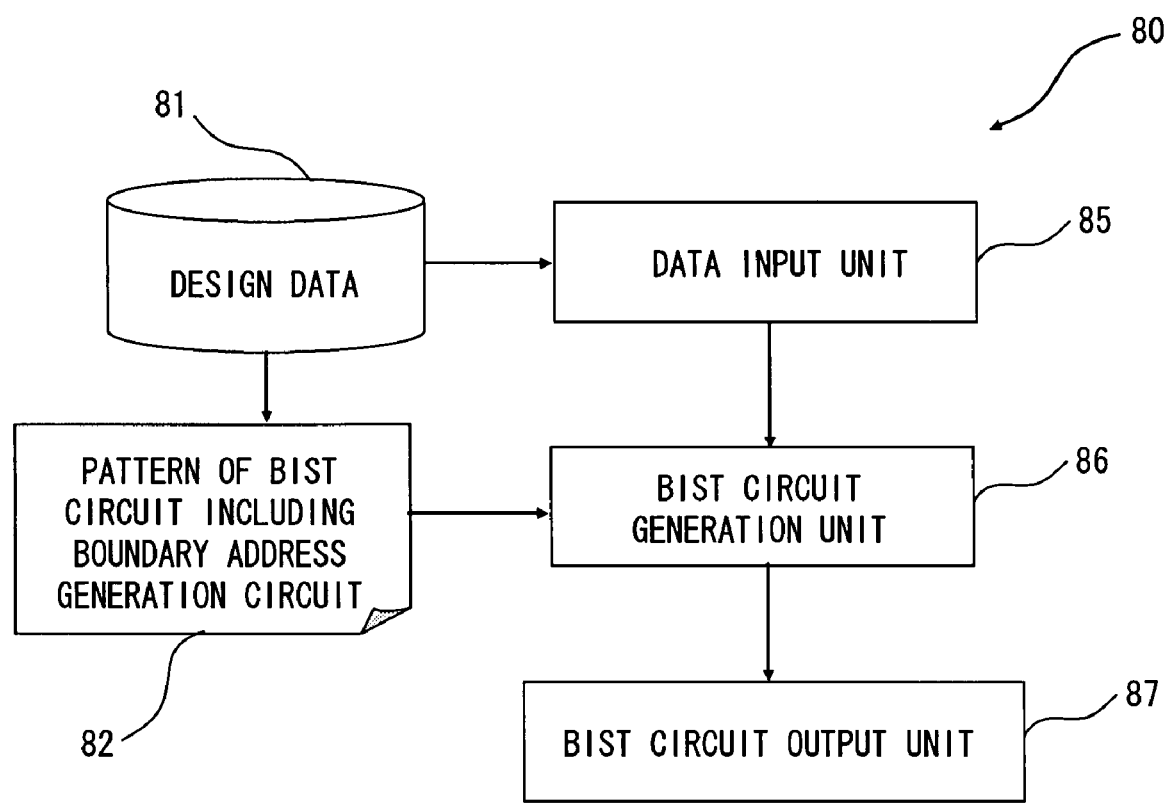
FIG. 21 shows a design device of the BIST circuit according to the third embodiment of the present invention.
Figure 22:
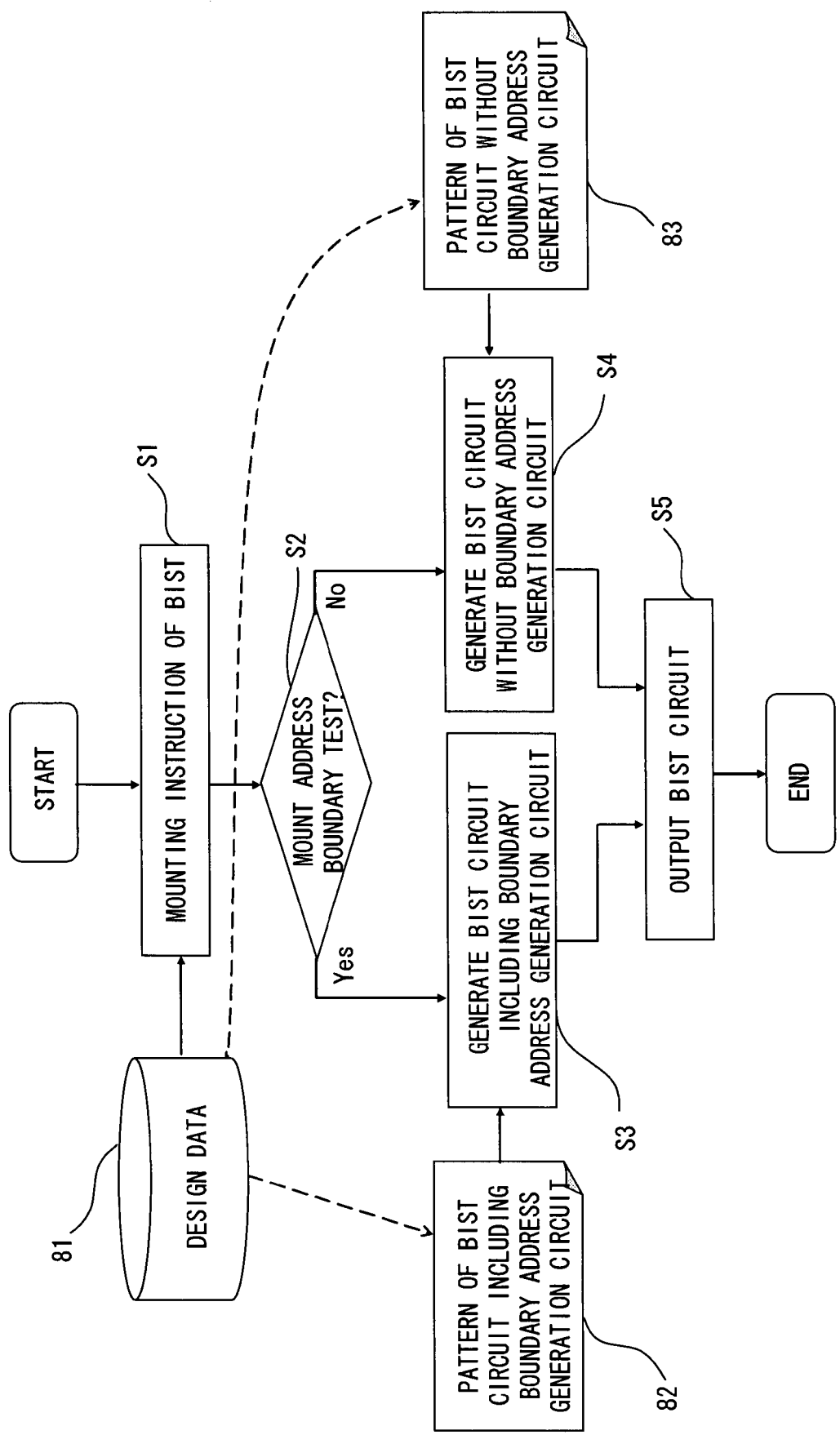
FIG. 22 shows a design method of the BIST circuit according to the third embodiment of the present invention.
Figure 23:
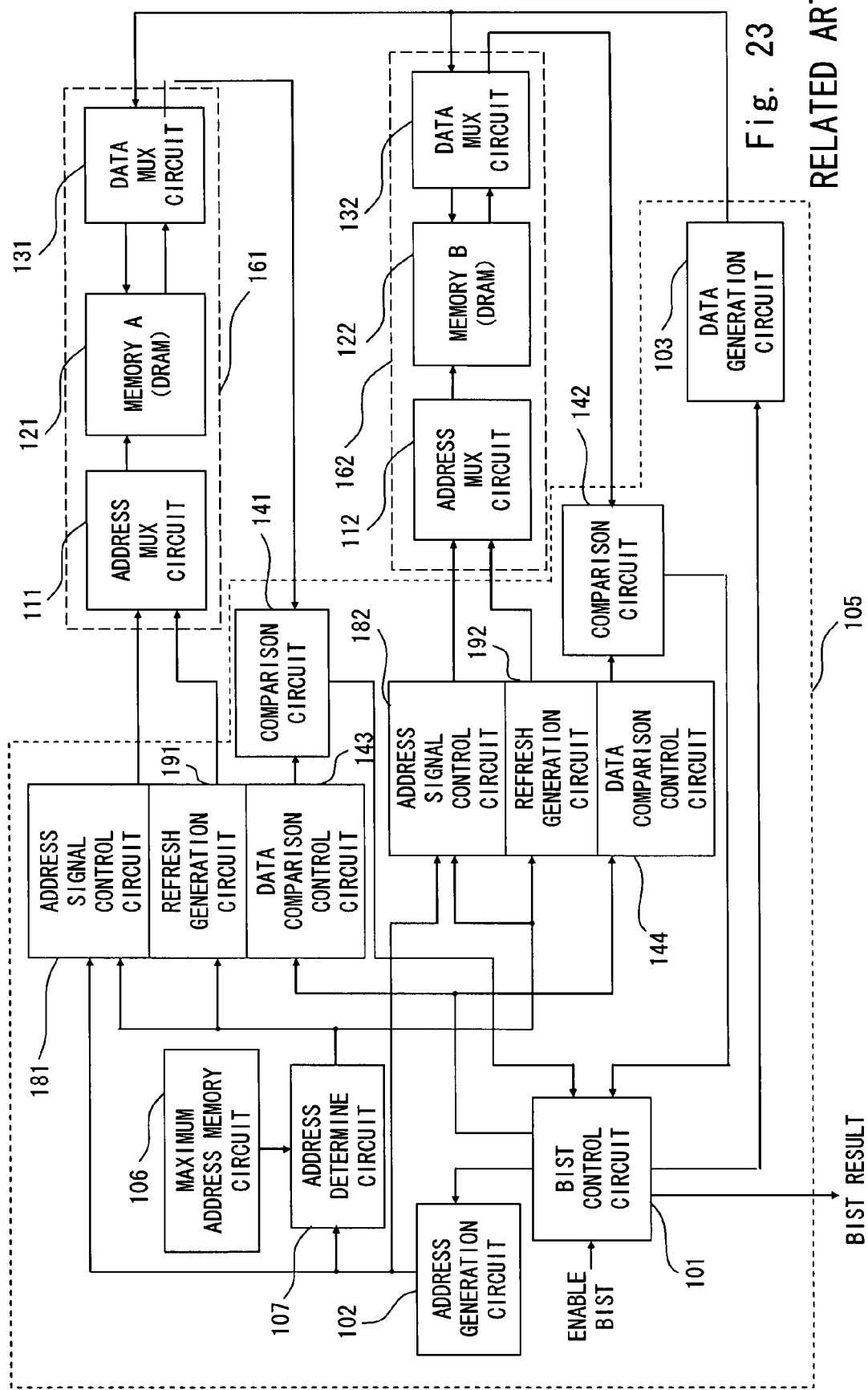
FIG. 23 is a block diagram showing the semiconductor integrated circuit disclosed by Sakamoto.
Figure 24:
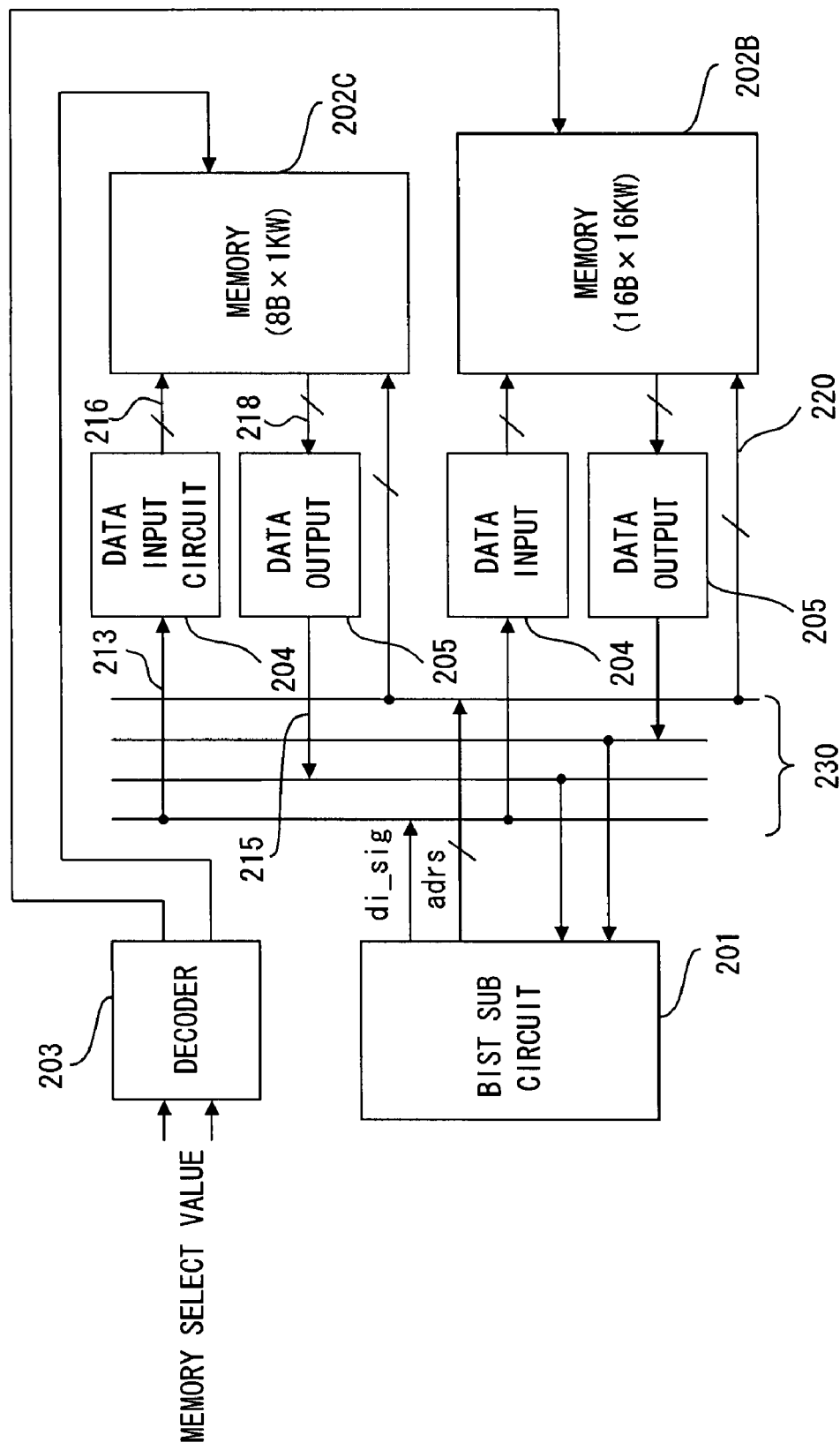
FIG. 24 shows the semiconductor integrated circuit disclosed by Ida.
Figure 25:
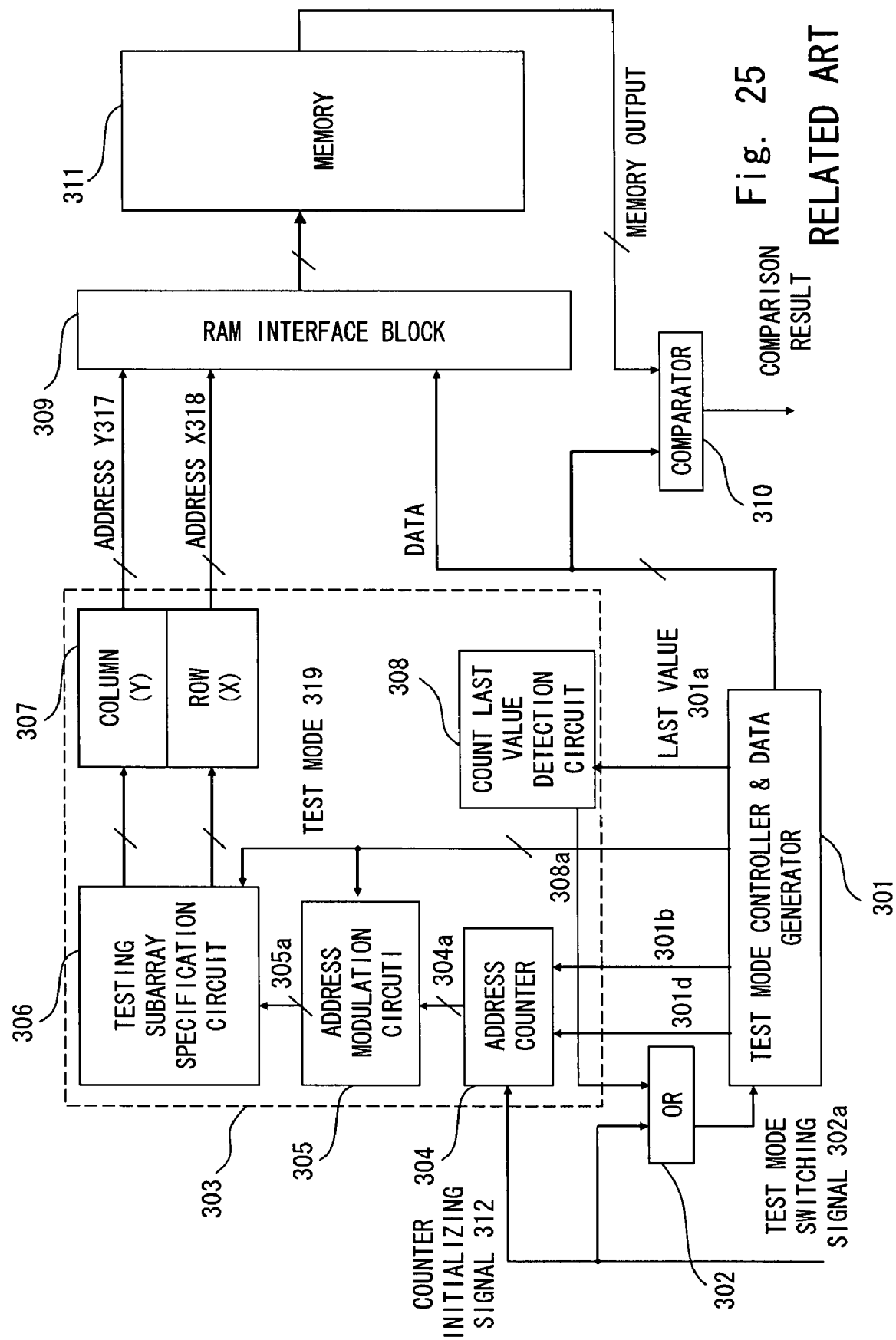
FIG. 25 is a block diagram showing a semiconductor integrated circuit disclosed by Yoshizawa.

Next, a design device and design method of such BIST circuit are explained. FIGS. 21 and 22 show the design device and the design method of a BIST circuit according to this embodiment. As shown in FIG. 21, a design device 80 includes a data input unit 85 to input necessary data for designing a BIST circuit from design data (netlist), a BIST circuit generation unit 86 to obtain a pattern of the BIST circuit and generating the BIST circuit using the input data from the data input unit 85 and a BIST circuit output unit 87 to output the generated BIST circuit.

Then, the operation of this design device is explained with reference to FIGS. 21 and 22. In the design device shown in FIG. 21, firstly the data input unit 85 inputs data such as the size and the number of memory from design data 81 of a LSI into the BIST circuit generation unit 86 and gives a mounting instruction of a BIST circuit (step S1). Next, the design device determines whether to mount an address cell boundary test in the BIST circuit (step S2). When mounting an address cell boundary test, the BIST circuit generating unit 86 obtains a pattern 82 of the BIST circuit including a boundary address generation circuit that can perform an address cell boundary test from the design data 81 to generate the BIST circuit that can perform an address cell boundary test (step S3). In this case, as described above, a row address MAX value and a column address MAX value or the like that are held by the boundary address generation circuit shown in FIG. 2, for example, are input. On the other hand, when not mounting an address cell boundary test, a pattern 83 of a BIST circuit not including a boundary address generation circuit is obtained to generate the BIST circuit (step S4). Then, the test circuit generated at the end is output (step S5).

In this embodiment, since the BIST circuit which can perform the boundary test for detecting a Read failure between memory cell boundaries can be mounted, a semiconductor integrated circuit with high reliability can be designed.

It is apparent that the present invention is not limited to the above embodiments, but may be modified and changed without departing from the scope and spirit of the invention.

What is claimed is:

1. A semiconductor integrated circuit comprising:
   a memory; and
   a BIST circuit to test the memory, the BIST circuit including a boundary address generation circuit to generate a row address pattern or a column address pattern of the memory and at least one of the row address pattern or the column address pattern having alternately a top address and a bottom address.

2. The semiconductor integrated circuit according to claim 1, wherein the memory comprises a plurality of the memories.

3. The semiconductor integrated circuit according to claim 2, wherein the BIST circuit includes a BIST main circuit in common with the plurality of memories and a BIST sub circuit provided to corresponding one of the memories, and the BIST sub circuit includes the boundary address generation circuit.

4. The semiconductor integrated circuit according to claim 3, wherein the BIST main circuit includes an address generator to generate an address pattern for a test other than the boundary test, and
the BIST sub circuit compares a size of the memory with an address input from the address generator and in case the address is a non-existing address in the memory, the BIST sub circuit controls not to read out test data and perform an expected value comparison.

5. The semiconductor integrated circuit according to claim 1, wherein the memory comprises a plurality of memories with different address configurations.

6. The semiconductor integrated circuit according to claim 1, wherein the boundary address generation circuit alternately generate the top address and the bottom address as either one of the row address pattern or the column address pattern and outputs an incremented or a decremented address pattern to each of the top address or the bottom address as other address pattern.

7. The semiconductor integrated circuit according to claim 1, wherein the boundary address generation circuit generates an address pattern including the top address or the bottom address to sequentially access cells positioned in diagonal lines of the memory.

8. The semiconductor integrated circuit according to claim 1, wherein the boundary address generation circuit includes a top address memory unit to store the top address.

9. The semiconductor integrated circuit according to claim 1, wherein the boundary address generation circuit includes a top address memory unit to store the top address and a top/bottom address generation unit to read out the top address and alternately outputs the top address and the bottom address.

10. A BIST circuit comprising;
an address generation unit to generate an address for a boundary test, the boundary test being an access test to a boundary cell with at least one of a row or a column address pattern of a memory includes a top address or a bottom address, and the address pattern being the row or the column address pattern of the memory and for at least one of the row address pattern or the column address pattern, the top address and the bottom address are alternated; and
an expected value checking unit to check test data read out from the memory with an expected value.

11. The BIST circuit according to claim 10, further comprising:
a main BIST circuit provided in common with a plurality of memories; and
sub BIST circuits provided individually to the plurality of memories,
wherein the sub BIST circuit includes a boundary address generation circuit to alternately generate the top address and the bottom address.

12. The BIST circuit according to claim 10, wherein the boundary address generation circuit alternately generates the top address and the bottom address as either one of the row address pattern or the column address pattern and generates an incremented or a decremented address pattern for each of the top and the bottom address.

13. The BIST circuit according to claim 10, wherein the boundary address generation circuit generates addresses including the top address or the bottom address to sequentially access cells positioned in diagonal lines of the memory.

14. The BIST circuit according to claim 10, wherein the boundary address generation circuit includes a top address memory unit to store the top address.

15. The BIST circuit according to claim 10, wherein the boundary address generation circuit includes a top address memory unit to store the top address and a top/bottom address generation unit to read out the top address and alternately outputs the top address and the bottom address.

16. A method performed by a design program product of a BIST circuit to execute a certain operation, the method comprising:
selecting a pattern of a BIST circuit, the BIST circuit being able to perform a boundary test to conduct an access test for a boundary cell including at least one of row or column addresses of a memory having a alternative a top address and a bottom address; and
generating a BIST circuit using the pattern.

17. A method of designing a BIST circuits comprising:
inputting, via a data input unit, the number and a size of a memory; and
generating, via a BIST circuit generation unit, a BIST circuit using data input from the data input unit and a pattern of a BIST circuit, the BIST circuit being able to perform a boundary test to conduct an access test for a boundary cell including at least one of a row or a column address of a memory having a top address or a bottom address.

18. A method of testing a memory comprising:
accessing a boundary cell including at least one of a row address or a column address of a memory having a top address or a bottom address; and
reading out data from the boundary cell to check with an expected value.

19. The method according to claim 18, further comprising: reading out data from the boundary cell while incrementing or decrementing an address for each of the top address or the bottom address to one of the row address or the column address of the memory, together with alternately selecting the top address and the bottom address for an other one of the row address or the column address of the memory.

* * * * *